United States Patent
Kumagai et al.

[11] Patent Number: 5,645,638
[45] Date of Patent: Jul. 8, 1997

[54] METHOD AND APPARATUS FOR PREPARING CRYSTALLINE THIN-FILMS FOR SOLID-STATE LASERS

[75] Inventors: Hiroshi Kumagai, Wako; Kouichi Toyoda, Kawagoe, both of Japan

[73] Assignee: Rikagaku Kenkyusho, Saitama, Japan

[21] Appl. No.: 590,678

[22] Filed: Jan. 29, 1996

Related U.S. Application Data

[63] Continuation of Ser. No. 191,191, Feb. 3, 1994, abandoned.

[30] Foreign Application Priority Data

Feb. 4, 1993 [JP] Japan .................................. 5-040551

[51] Int. Cl.$^6$ .................................................. C30B 25/14
[52] U.S. Cl. ........................... 117/89; 117/92; 117/103; 117/105; 117/108; 117/904; 117/939; 117/940; 117/945; 117/950
[58] Field of Search .............................. 117/89, 92, 103, 117/105, 108, 904, 939, 940, 945, 950

[56] References Cited

U.S. PATENT DOCUMENTS

| | | | |
|---|---|---|---|
| 4,137,108 | 1/1979 | Ihara et al. | 117/950 |
| 4,211,803 | 7/1980 | Cowher et al. | 427/128 |
| 4,247,359 | 1/1981 | Venkatasetly | 117/945 |
| 4,413,022 | 11/1983 | Suntela et al. | 117/950 |
| 4,711,696 | 12/1987 | Kokta | 117/950 |
| 4,836,953 | 6/1989 | Kokta | 117/950 |
| 4,988,402 | 1/1991 | Kokta | 117/945 |
| 5,023,877 | 6/1991 | Eden et al. | 372/7 |
| 5,037,200 | 8/1991 | Kodama | 356/252 |
| 5,142,548 | 8/1992 | Krasinski et al. | 372/105 |

FOREIGN PATENT DOCUMENTS

3005536  8/1980  Germany.

OTHER PUBLICATIONS

"RF Sputtering Crystal Growth . . ." *Japanese Journal of Applied Physics* vol. 23, No. 3 Mar. 1984, pp. 312–316 by Mitsuo Yamaga et al.

"Metalorganic Molecular Beam . . ." *Applied Physics Letters* vol. 52, No. 20 May 16, 1988, pp. 1672–1674 by Kazuaki Sawada et al.

G.S. Higashi et al, Applied Physics Letters, vol. 55, No. 19, Nov. 6, 1989, pp. 1963–1965.

*Primary Examiner*—Robert Kunemund
*Attorney, Agent, or Firm*—Birch, Stewart, Kolasch & Birch, LLP

[57] ABSTRACT

The present invention has been achieved by perceiving the fact to the effect that a semiconductor production process-like manner such as CVD method or the like by which materials and film thickness can be controlled in an atomic scale may be utilized in case of preparing thin-film crystal, and employing such semiconductor production process-like manner being quite different from conventional technique. The invention relates to preparation of crystalline thin-films for solid-state lasers wherein a substrate contained in a vessel under a high vacuum condition is heated, materials for forming the laser material are supplied onto the surface of the aforesaid substrate in the form of gas, ion, single metal or metal compound to grow crystal on the surface of the aforesaid substrate, and a material of active ionic species is supplied onto the surface of the aforesaid substrate simultaneously with supply of the aforesaid materials for forming the laser host crystal, thereby controlling valence number of the material of active ionic species so as to be identical with the valence number of the metal ion constituting the crystal of the aforesaid laser host crystal.

14 Claims, 10 Drawing Sheets

DEPENDENCY OF SUBSTRATE TEMPERATURE GROWTH RATE

| METALLIC MATERIAL FOR FORMING LASER HOST CRYSTAL | OXIDIZING AGENT FOR FORMING LASER HOST CRYSTAL | METALLIC MATERIAL FOR AFFORDING ACTIVE IONIC SPECIES — $Ti^{3+}$ | SUB-STRATE |
|---|---|---|---|
| △Al | O (PREPARED BY LASER DECOMPO-SITION WITH PLASMA) | △Ti | $Al_2O_3$ |
| △$AlF_3$ | | △$TiCl_3$ | Si |
| △$AlCl_3$ | $O_2$ | ○$TiCl_4$ | $SiO_2$ |
| △$AlBr_3$ | $O_3$ | △$TiBr_4$ | GaAs |
| △$AlI_3$ | $N_2O$ | △$TiI_4$ | InP |
| △$Al(OCH_3)_3$ | $NO_2$ | △$Ti(OCH_3)_4$ | |
| △$Al(OC_2H_5)_3$ | $N_2O_4$ | ○$Ti(OC_2H_5)_4$ | |
| △$Al(i-OC_3H_7)_3$ | $H_2O$ | ○$Ti(OC_3H_7)_4$ | |
| △$Al(OC_4H_9)_3$ | $H_2O_2$ | ○$Ti(OC_4H_9)_4$ | |
| ○$Al(CH_3)_3$ | $D_2O$ | △$TiO_2$ | |
| ○$Al(C_2H_5)_3$ | | | |

NO MARK  GAS AT 20°C UNDER 1 ATM
○ LIQUID AT 20°C UNDER 1 ATM REQUIRED FOR UTILIZATION OF VAPOR PRESSURE OR HEATING
△ SOLID AT 20°C UNDER 1 ATM REQUIRED FOR HEATING

| METALLIC MATERIAL FOR FORMING LASER HOST CRYSTAL | OXIDIZING AGENT FOR FORMING LASER HOST CRYSTAL | METALLIC MATERIAL FOR AFFORDING ACTIVE IONIC SPECIES | SUB-STRATE |
|---|---|---|---|

○ $Al(C_3H_7)_3$
○ $Al(i-C_4H_9)_3$
○ $Al(CH_3)_2Cl$
△ $Al(CH_3)Cl_2$
△ $Al_2(CH_3)_3Cl_3$
○ $Al(C_2H_5)_2Cl$
○ $Al(C_2H_5)Cl_2$
△ $Al_2O_3$
○ $Al(CH_3)_2H$
○ $Al(C_2H_5)_2H$
○ $Al(i-C_4H_9)_2H$
△ $AlH_3 \cdot N(CH_3)_3$
○ $AlH_3 \cdot N(C_2H_5)_3$
○ $AlH_3 \cdot N(CH_3)_2(C_2H_5)$
○ $AlH_3 \cdot N(C_3H_7)_3$
○ $AlH_3 \cdot N(C_4H_9)_3$ ⎯⎯ $Cr^{3+}$ ⎯⎯
△ Cr
△ $CrF_2$
△ $CrF_3$
△ $CrCl_2$
△ $CrBr_2$
△ $CrBr_3$
○ $CrO_2Cl_2$
△ $Cr_2O_3$
△ $CrO_3$ NO MARK GAS AT 20° C UNDER 1 ATM
○ LIQUID AT 20° C UNDER 1 ATM REQUIRED FOR UTILIZATION OF VAPOR PRESSURE OR HEATING
△ SOLID AT 20° C UNDER 1 ATM REQUIRED FOR HEATING

[$Y_3Al_5O_{12}$]

| METALLIC MATERIAL (I) FOR FORMING LASER HOST CRYSTAL | METALLIC MATERIAL (II) FOR FORMING LASER HOST CRYSTAL | OXIDIZING AGENT FOR FORMING LASER HOST CRYSTAL | METALLIC MATERIAL FOR AFFORDING ACTIVE IONIC SPECIES | SUB-STRATE |
|---|---|---|---|---|
| △Y | Al GROUP [THE SAME AS IN CASE OF $Al_2O_3$] | O GROUP [THE SAME AS IN CASE OF $Al_2O_3$] | ⎡$Nd^{3+}$⎤ ⎣△Nd⎦ | $Y_3Al_5O_{12}$ |
| △$YF_3$ | | | ⎡$Gd^{3+}$⎤ ⎣△Gd⎦ | si |
| △$YCl_3$ | | | ⎡$Ho^{3+}$⎤ ⎣△Ho⎦ | $siO_3$ |
| △$Y_2O_3$ | | | ⎡$Er^{3+}$⎤ ⎣△Er⎦ | GaAs |
| △Y(ACAC)$_3$ | | | ⎡$Tm^{3+}$⎤ ⎣△Tm⎦ | InP |
| △Y(DPM)$_3$ | | | ⎡$Cr^{3+}$⎤ Cr GROUP THE SAME AS IN CASE OF $Al_2O_3$ | $Al_2O_3$ |
| △Y(HFA)$_3$ | | | | |

FIG. 7

NO MARK GAS AT 20°C UNDER 1 ATM
○ LIQUID AT 20°C UNDER 1 ATM REQUIRED FOR UTILIZATION OF VAPOR PRESSURE OR HEATING
△ SOLID AT 20°C UNDER 1 ATM REQUIRED FOR HEATING

ACAC : ABBREVIATION OF ACETYL ACETONE
DPM : ABBREVIATION OF DIPIVALOYL METHANE
HFA : ABBREVIATION OF HEXAFLUOROACETYL ACETONE

[LiYF₄]

| METALLIC MATERIAL (I) FOR FORMING LASER HOST CRYSTAL | METALLIC MATERIAL (II) FOR FORMING LASER HOST CRYSTAL | HALOGENIZING AGENT FOR FORMING LASER HOST CRYSTAL | METALLIC MATERIAL FOR AFFORDING ACTIVE IONIC SPECIES | SUB-STRATE |
|---|---|---|---|---|
| △Li | Y GROUP | F | $\begin{bmatrix} Pr^{3+} \\ △Pr \end{bmatrix}$ | LiYF₄ |
| △LiF | [THE SAME AS IN CASE OF Y₃Al₅O₁₂] | | | |
| △LiCl | | | | |
| △LiBr | | $F_2$ | $\begin{bmatrix} Nd^{3+} \\ △Nd \end{bmatrix}$ | Si |
| △LiI | | | | |
| △LiOCH₃ | | | $\begin{bmatrix} Ho^{3+} \\ △Ho \end{bmatrix}$ | |
| △LiOC₂H₅ | | $NF_3$ | | SiO₂ |
| △LiOC₃H₇ | | | | |
| △Li(t-OC₄H₉) | | | $\begin{bmatrix} Er^{3+} \\ △Er \end{bmatrix}$ | |
| △LiCH₃ | | $CF_4$ | | GaAs |
| △LiC₂H₅ | | | | |
| OLiC₃H₇ | | | | |
| OLi(secC₄H₉) | | $CHF_3$ | | InP |
| △Li₂O | | | | |
| △Li₂CO₃ | | | | |
| △Li(ACAC) | | $CH_2F_2$ | | Al₂O₃ |
| △Li(DPM) | | | | |
| △Li(HFA) | | $CH_3F$ | | |
| △LiN[(CH₃)₃Si]₂ | | | | |

FIG. 8

NO MARK GAS AT 20° C UNDER 1 ATM
O LIQUID AT 20° C UNDER 1 ATM REQUIRED FOR UTILIZATION OF VAPOR PRESSURE OR HEATING
△ SOLID AT 20° C UNDER 1 ATM REQUIRED FOR HEATING

ACAC : ABBREVIATION OF ACETYL ACETONE
DPM : ABBREVIATION OF DIPIVALOYL METHANE
HFA : ABBREVIATION OF HEXAFLUOROACETYL ACETONE

METHOD AND APPARATUS FOR PREPARING CRYSTALLINE THIN-FILMS FOR SOLID-STATE LASERS

This application is a continuation of application Ser. No. 08/191,191 filed on Feb. 3, 1994, now abandoned.

BACKGROUND OF THE INVENTION

1. Field of the Invention

The present invention relates to a method and an apparatus for preparing crystalline thin-films for solid-state lasers, and more particularly to a method and an apparatus for preparing crystalline thin-films for solid-state lasers by which such crystalline thin-films for solid-state lasers which can be used for the development of micro-cavity and the like, and allowed solid-state laser to directly grow on a semiconductor laser can be prepared.

2. Description of the Related Art

Recently, in order to respond a variety of needs for shorter laser wavelength, expansion in wavelength band to be oscillated, higher output power in laser, higher efficiency in laser and higher quality in beam and so on, extensive studies have been made with respect to research for novel solid-state laser materials, and higher quality in the solid-state laser crystals than have been heretofore known.

Heretofore, solid-state laser crystals have been prepared by the flux method, crystal pulling method or Verneuil's method and the like method. These methods will be described in brief hereinbelow.

Flux Method

In this method, crystal is deposited and grown from a molten material at a high temperature, and a molten inorganic salt or an oxide functions as its solvent.

Crystal Pulling Method

In this method, a seed crystal is dipped in molten liquid or saturated solution to be compatible with each other, and then the seed crystal is gradually pulled up to grow a single crystal on the extreme end portion of the seed crystal.

Verneuil's method

In this method, a raw material which has been finely pulverized is blown into high temperature flame such as oxyhydrogen flame and the like to heat and melt the raw material, and the molten material is received by a seed crystal so as to grow a single crystal thereon.

As described above, in any of conventional methods, first a material intended to be a solid-state laser crystal is molten at high temperatures, and then either a crystal is deposited and grown, or a single crystal is allowed to grow on the seed crystal.

While the above described flux method, crystal pulling method or Verneuil's method and the like are very effective methods for preparing a large bulk crystal, it is difficult to achieve uniform dispersion of active ionic species intented to be the emission subject of a laser beam, as a result of spatial control in laser host crystal, and prevention of inclusion of ionic species intended to be the absorption subject of laser beam into laser host crystal is difficult.

More specifically, since solid-state laser crystal is allowed to grow in a rod-like shape in the prior art, temperatures are different in the central portion of the rod-like solid-state laser crystal as compared to from the peripheral portion thereof, and as a result diffusion conditions of ion in both the portions are different. Accordingly, it is difficult to effect uniform doping of the active ionic species intended to be the emission subject along the axial and diametrical directions of solid-state laser crystal. For this reason, uniform dispersion of active ionic species in the laser host crystal could not have been attained heretofore.

Furthermore, since it is difficult to control valence number of the ion to be doped as active ion species, there have been problems where in the ion which had been doped did not become the emission subject of laser beam, but rather became the ion species which is absorption subject of laser beam. For example, in such a case where $Al_2O_3$ is used as laser host crystal, and doping is effected by using Ti as active ionic species, when Ti is trivalent, it becomes the emission subject, but when Ti is di- or tetravalent, it becomes the absorption subject. As described above, it was extremely difficult to control such valence number in the prior art.

Moreover, as described above, while in the prior art is preferable to prepare a large bulk crystal, it is difficult to prepare thin-film crystal. Accordingly, it was difficult to control film thickness on an atomic scale.

In the above described prior art, a solid-state laser crystal is prepared by the manner quite different from the conventional semiconductor production process. Thus, it was impossible to grow a solid-state laser crystal on a semiconductor substrate in a high-vacuum vessel containing the semiconductor substrate which is used for semiconductor production process. For this reason, solid-state laser crystal heretofore could not be produced in combination with semiconductor and semiconductor laser.

OBJECTS AND SUMMARY OF THE INVENTION

In view of various problems involved in the prior art, the present invention has been made by perceiving the fact to the effect that a semiconductor production process-like manner such as CVD (Chemical Vapor Deposition) method, wherein a material in gaseous form is used, and the gas is thermally decomposed on a substrate, whereby the material is deposited on the substrate, by which the material and the film thickness can be controlled on an atomic scale, or the like method can be used in preparation of thin-film crystal. An object of the present invention is to provide a method and an apparatus for preparing crystalline thin-films for solid-state lasers in which a semiconductor production process-like manner, quite different from the prior art, is utilized and by which the above described problems involved in the prior art can be overcome.

More specifically, an object of the present invention is to provide a method and an apparatus for preparing crystalline thin-films for solid-state lasers by which an active ionic species can be uniformly distributed into its laser host crystal.

Furthermore, another object of the present invention is to provide a method and an apparatus for preparing crystalline thin-films for solid-state lasers by which the valence number of the active ionic species can be controlled.

Still further, another object of the present invention is to provide a method and an apparatus for preparing crystalline thin-films for solid-state lasers by which film thickness can be controlled on an atomic scale.

Yet further, another object of the present invention is to provide a method and an apparatus for preparing crystalline thin-films for solid-state lasers which can produce solid-state laser crystals in combination with semiconductor or semiconductor laser.

It is to be noted that the semiconductor production process-like manner involves the above described CVD method used for growth of gallium arsenide and the like, MBE (Molecular Beam Epitaxy) method, ALE (Atomic Layer Epitaxy) method, Ablation Deposition Method and the like, and such manners wherein crystal is allowed to grow on a heated substrate as a result of supplying a material gas, or gaseous or beam-like molecule or ion onto the substrate are named generically as "semiconductor production process-like manner".

In order to attain the above described objects, the method for preparing crystalline thin-films for solid-state lasers according to the present invention is characterized by the steps of heating a substrate in a vessel under a high vacuum condition, supplying materials for forming the laser material onto the surface of said substrate in the form of a gas, an ion, and a single metal or a metal compound to prow crystal on the surface of said substrate, and supplying a material of active ionic species onto the surface of said substrate simultaneously with supply of said materials for forming the laser host crystal, thereby controlling the valence number of the material of active ionic species so as to be identical with the valence number of the metal ion constituting the crystal of said laser host crystal.

Furthermore, the apparatus for preparing crystalline thin-films for solid-state lasers according to the present invention is characterized by being provided with a vessel, the inside of which has been highly evacuated and for containing a substrate onto the surface of which is subjected crystal growth of crystalline thin-films for solid-state lasers, a heating device for heating said substrate, a laser host crystal supplying device for supplying materials for forming the laser host crystal onto the surface of said substrate contained inside said vessel in the form of a gas, an ion, a single metal or a metal compound, and a material of active ionic species supplying device for supplying a material of active ionic species onto the surface of said substrate contained inside said vessel simultaneously with supply of said materials for forming the laser host crystal.

According to the above described invention, a substrate is heated in a vessel under a high vacuum condition, and materials for forming the laser host crystal are supplied in the form of a gas, an ion, a single metal or a metal compound onto the surface of the aforesaid substrate to grow a crystal thereon. Accordingly, solid-state laser crystal can be grown on even a semiconductor substrate such as Si and the like, other than seed crystal as in the case of a semiconductor production process-like manner.

Moreover, since a material of active ionic species is supplied onto the surface of a substrate simultaneously with supply of materials for forming the laser host crystal, it is possible to control the valence number of the material of active ionic species so as to be identical with valence number of the metal ion constituting crystal of the laser host crystal. Thus, few defective solid-state laser crystals, in which no absorption subject or a controlled, small amount of absorption subject exists can be prepared.

In addition to the above, it is easy to control film thickness on an atomic scale, and a material of active ionic species can uniformly be injected from a spatial point of view.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIG. 6 is a table showing an example of possible combination among materials of laser host crystal, materials of active ionic species and materials of substrate in the case where $Al_2O_3$ is formed as the laser host crystal;

FIG. 7 is a table showing an example of possible combination among materials of laser host crystal, materials of active ionic species and materials of substrate in the case where $Y_3Al_5O_{12}$ is formed as the laser host crystal;

FIG. 8 is a table showing an example of possible combination among materials of laser host crystal, materials of active ionic species and materials of substrate in the case where $LiYF_4$ is formed as the laser host crystal.

DETAILED DESCRIPTION OF THE PREFERRED EMBODIMENTS

Figure 1:
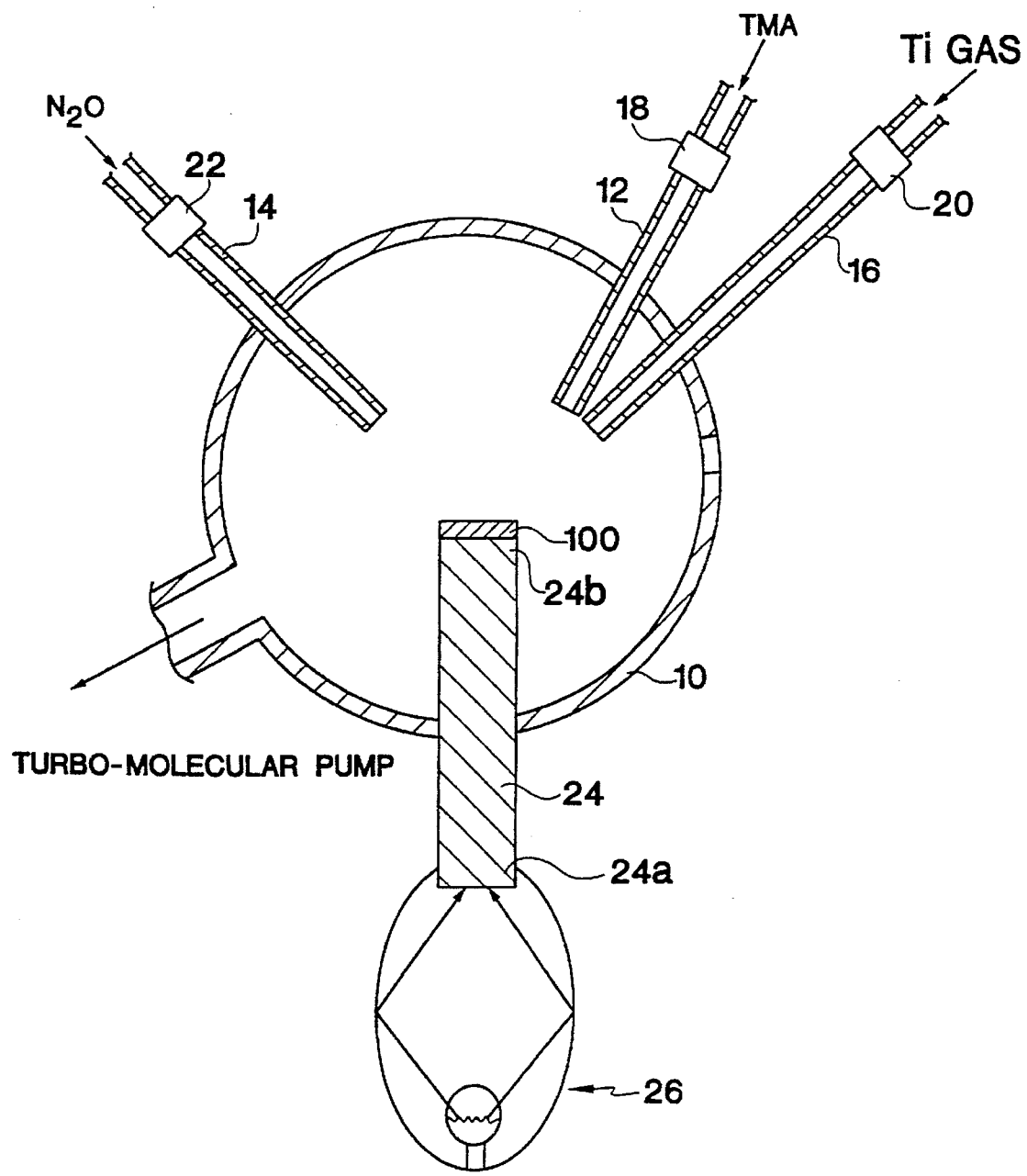
FIG. 1 is an explanatory view, in sectional construction, illustrating the apparatus for preparing crystalline thin-films for solid-state lasers according to an embodiment of the present invention.

Embodiments of the method and apparatus for crystalline thin-films for solid-state lasers according to the present invention will be described in detail hereinbelow by referring to the accompanying drawings. FIG. 1 illustrates an example of the apparatus for crystal-line thin-films for solid-state lasers according to the present invention and which comprises a cylindrical vessel 10 made of stainless steel, a connecting tube 12 which is connected with the vessel 10 and for supplying a metal material for forming a laser host crystal into the vessel 10, a connecting tube 14 which is connected with the vessel 10 and for supplying an oxidizing agent or halogenating agent for forming the laser host crystal into the vessel 10, a connecting tube 16 which is connected with the vessel 10 and for supplying a material of active ionic species into the vessel 10, an electromagnetic valve means 18 for opening and closing the connecting tube 12, an electromagnetic valve means 20 for opening and closing the connecting tube 14, an electromagnetic valve means 22 for opening and closing the connecting tube 16, a quartz rod 24 disposed vertically in the vessel 10 in such that one end 24a of which is positioned outside the vessel 10, and a halogen lamp 26 for emitting infrared rays into the end 24a to heat a substrate 100 rest on the other end 24b of the quartz rod 24. Furthermore, the interior of the vessel 10 is in high vacuum condition as a result of evacuation of an order of $10^{-7}$ Torr by means of a turbo-molecular pump (not shown).

In the above described construction, such a case where titanium-sapphire (laser host crystal: $Al_2O_3$, active ionic species: Ti) thin films are prepared as crystalline thin-films for solid-state lasers on the substrate 100 being Si (100) substrate by the use of a material gas alternately supplying type CVD method as a semiconductor production process-like manner will be described.

It is to be noted that a material such as Si (100), $\alpha$-$Al_2O_3$ or the like lattice constant of which matches with that of the laser host crystal may be used as the substrate 100. For example, in the case where α-$Al_2O_3$ is used as the substrate 100, there is no trouble because α-$Al_2O_3$ is the same material as that of the laser host crystal. While Si (100) is a material being different from that of the laser host crystal, both the lattice constants of these materials match with each other so that Si (100) can be used as the substrate 100.

In this connection, since the present embodiment is one in which $Al_2O_3$ is formed as the laser host crystal and Ti is used as the active ionic species, it is to be arranged such that to the vessel 10 are delivered trimethylaluminum (TMA) as a metallic material for forming the laser host crystal through the connecting tube 12 by opening and closing the electromagnetic valve 18 means, $N_2O$ as an oxidizing agent for forming the laser host crystal through the connecting tube 14 by opening and closing the electromagnetic valve means 20, and Ti gas as the material of active ionic species through the connecting tube 16 by opening and closing the electromagnetic valve means 22, respectively.

In this case, TMA, $N_2O$ and Ti gas are supplied into the vessel 10 as gas pulses in accordance with the following manner. Namely, TMA and $N_2O$ material gases are alternately jetted in every two seconds onto the substrate 100 placed on the vessel 10 for a gas jetting period of one second. More specifically, the TMA gas (or $N_2O$ gas) is supplied to the interior of the vessel 10 for one second to raise pressure of the TMA gas (or $N_2O$ gas), thereafter supply of the TMA gas and $N_2O$ gas is stopped for a period of two seconds, and the interior of the vessel 10 is evacuated by a turbo-molecular pump. Then, $N_2O$ gas (or TMA gas) is supplied for one second to elevate pressure of $N_2O$ gas (or TMA), thereafter supply of the TMA gas and $N_2O$ gas is stopped for a period of two seconds, and the interior of the vessel 10 is evacuated by the turbo-molecular pump. The treatment described herein is utilized as one cycle, and a prescribed number of times of this cycle is repeated. In this connection, one cycle requires six seconds. Furthermore, Ti gas being the active ionic species is supplied simultaneously with the TMA gas.

In addition, the substrate 100 is placed on the end 24b of the quartz rod 24, and is heated from the back thereof with infrared rays irradiated from the halogen lamp 26.

In this case, a base pressure is on an order of $1 \times 10^{-7}$ Torr and the pressure in the vessel 10 at the time of introducing the gas was set at $2 \times 10^{-4}$ Torr.

Figure 3:
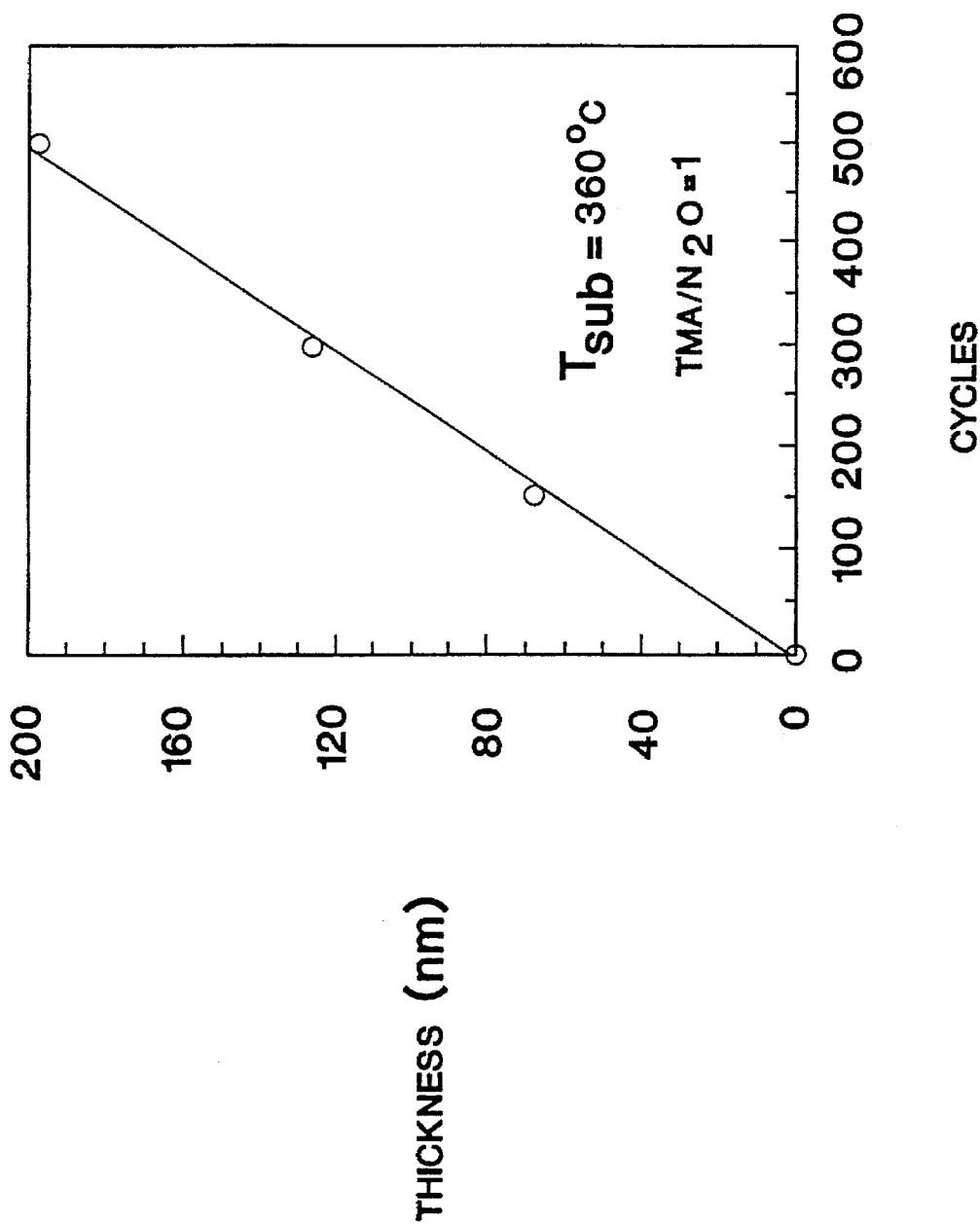
FIG. 3 is a graphical representation indicating dependency of number in gas supplying cycles for growth of $Al_2O_3$.

FIG. 3 is a graphical representation indicating dependency in number of gas supplying cycle for growth of $Al_2O_3$ film on Si (100) as the substrate 100 thickness (a thickness of the thin film: nm) is plotted as ordinate and number of cycles as abscissa. As described above, both the pressures of TMA and $N_2O$ in the vessel 10 were set at $2 \times 10^{-4}$ Torr (pressure ratio is "TMA/$N_2O$=1"), and the temperature of substrate was 360° C. ($T_{sub}$=360° C.). It is understood from FIG. 3 that the $Al_2O_3$ film thickness grows linearly at a rate of about 0.4 nm/cycle.

More specifically, a thickness of the $Al_2O_3$ film was proportional to the number of gas supplying cycle, and the growth rate was 0.4 nm/cycle. Furthermore, it was also found that as a result of XPS (X-ray photoelectron spectroscopy), a composition of the thin film had been stoichiometrically 2:3.

Next, both the pressures of TMA and $N_2O$ in the vessel 10 were set at $2 \times 10^{-4}$ Torr as in the case described above, respectively, and a temperature of the substrate ($T_{sub}$) was changed. The results in this case were measured by a spectroscopic ellipsometer with respect to the thin films and refractive indices.

Figure 4:
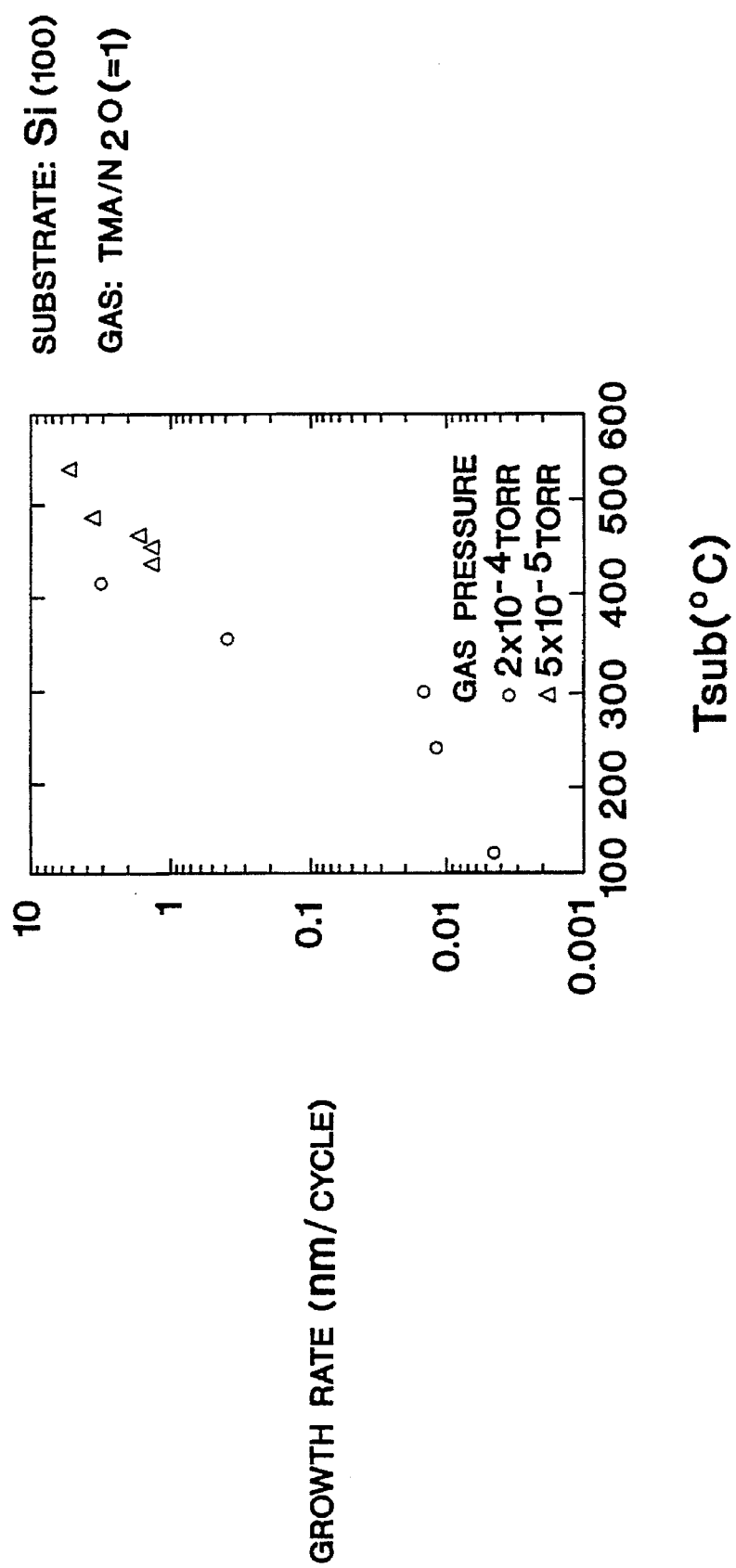
FIG. 4 is a graphical representation indicating a relationship between changes in temperature of a substrate and its growth rate.
Figure 5:
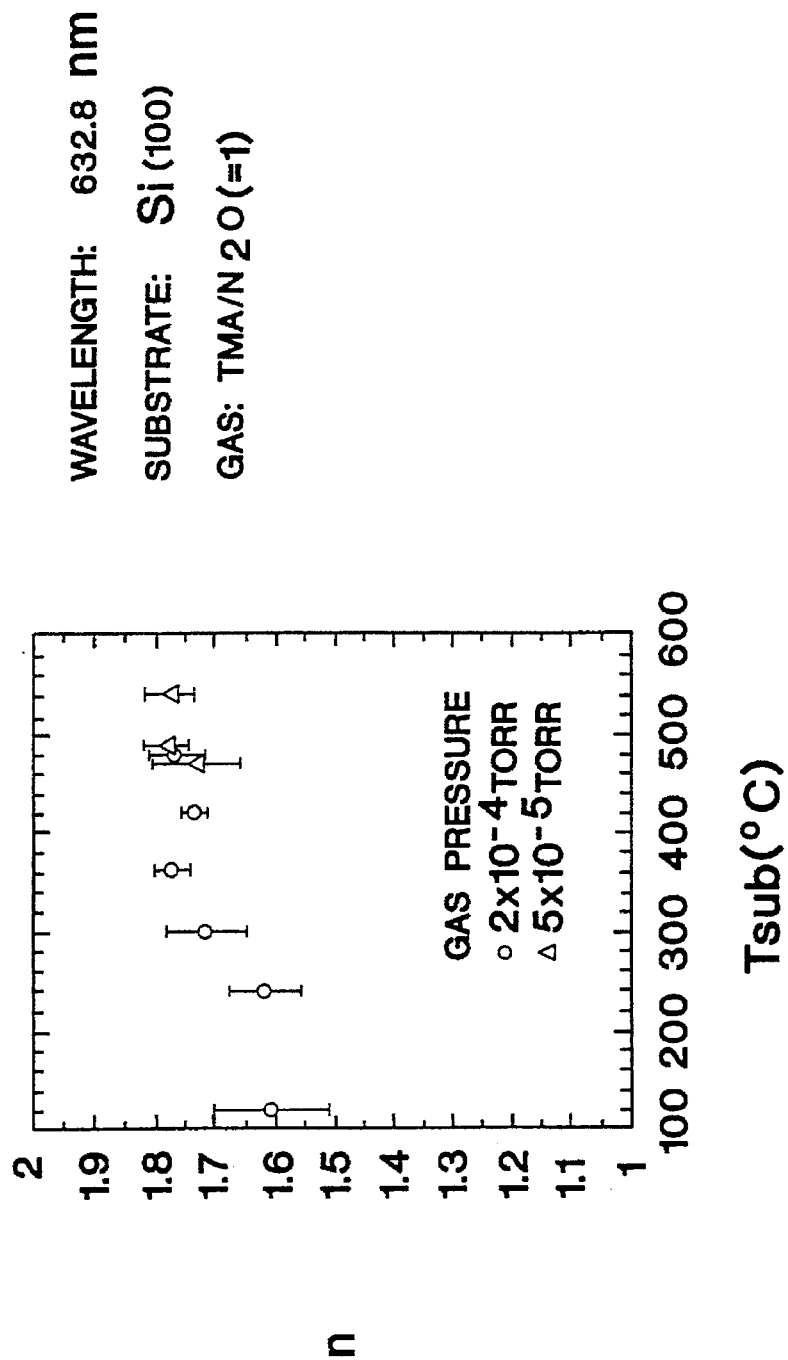
FIG. 5 is a graphical representation indicating a relationship between changes in temperature of a substrate and refractive indices at 632.8 nm.

FIG. 4 is a graphical representation indicating a relationship between growth rate of the thin film and temperature changes in the substrate in which the growth rate (speed of growth: nm/cycles) obtained by dividing film thickness with number of cycle is plotted as ordinate and changes in temperatures (°C.) of the substrate ($T_{sub}$) as abscissa. Furthermore, FIG. 5 is a graphical representation indicating a relationship between refractive indices of the thin film and changes in temperatures of substrate in which refractive indices (n) at 632.8 nm are plotted as ordinate and changes in temperature (°C.) of the substrate ($T_{sub}$) as abscissa.

Figure 2:
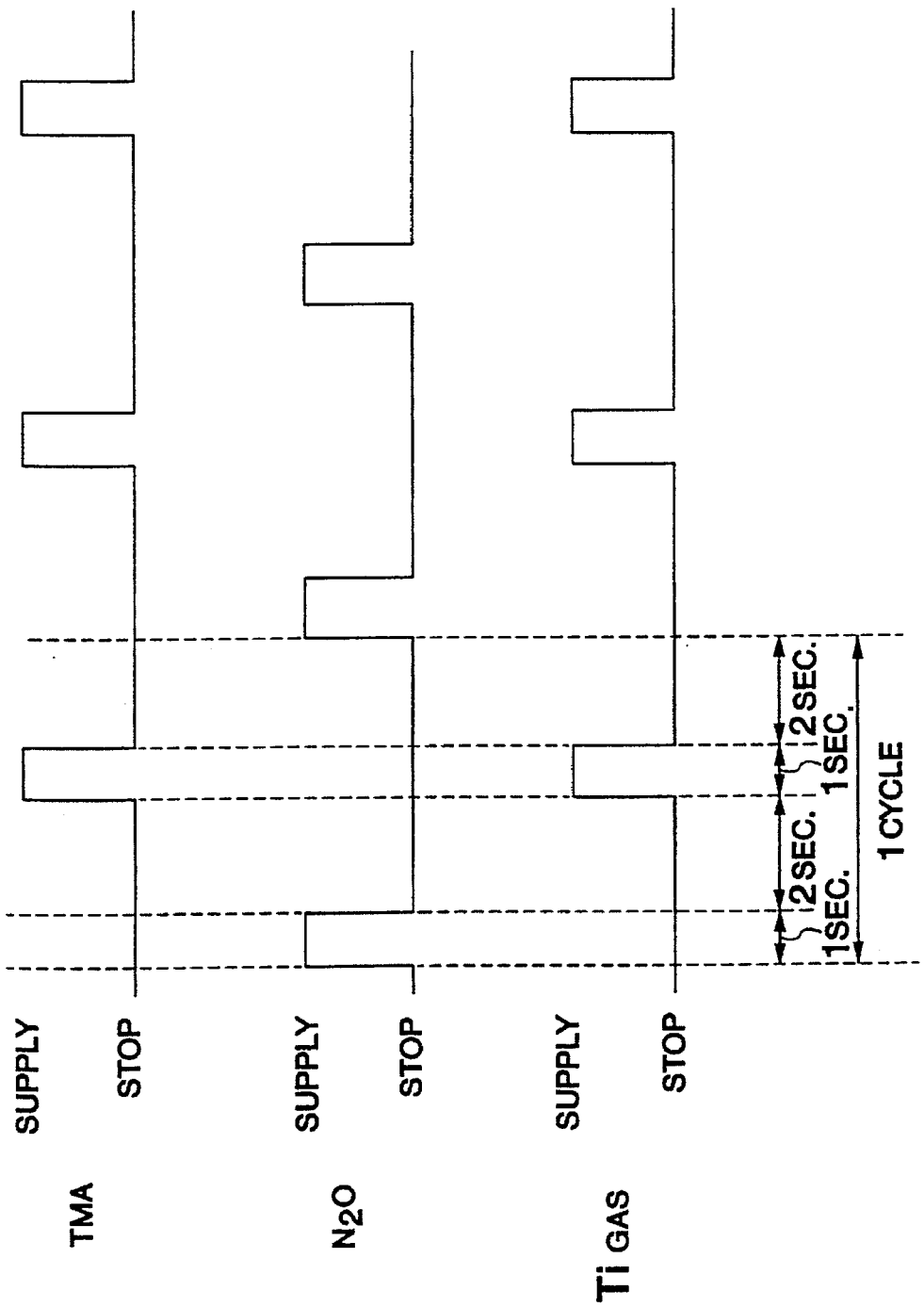
FIG. 2 is a timing chart indicating the timing of supplying gas pulses onto the surface of a substrate.

It is found from FIG. 4 that the growth rate is as low as 0.02 nm/cycle before the temperature reaches 320° C. In this case, the refractive indices were 1.6–1.7 which correspond to equal to or higher than the refractive index of amorphous $Al_2O_3$. At the higher substrate temperature of 360° C., the growth rate was 0.4 nm/cycle and the refractive index was 1.77, respectively. Accordingly, the optimum thin film growth rate is when the substrate temperature is at least 320° C. Moreover, timing at the doping of an active ionic species synchronizes with timing of the supply of TMA as shown in FIG. 2. According to this arrangement, trivalent Al is replaced by Ti so that the Ti to be doped may be made only trivalent or substantially trivalent.

FIGS. 6(a) through 8, inclusive, illustrate each example of possible combinations of materials of laser host crystal, materials of active ionic species, and materials of substrate wherein FIG. 6 shows a case of forming $Al_2O_3$ as the laser host crystal, FIG. 7 shows a case of forming $Y_3Al_5O_{12}$ as the laser host crystal, and FIG. 8 shows a case of forming $LiYF_4$ as the laser host crystal, respectively.

Figure 9:
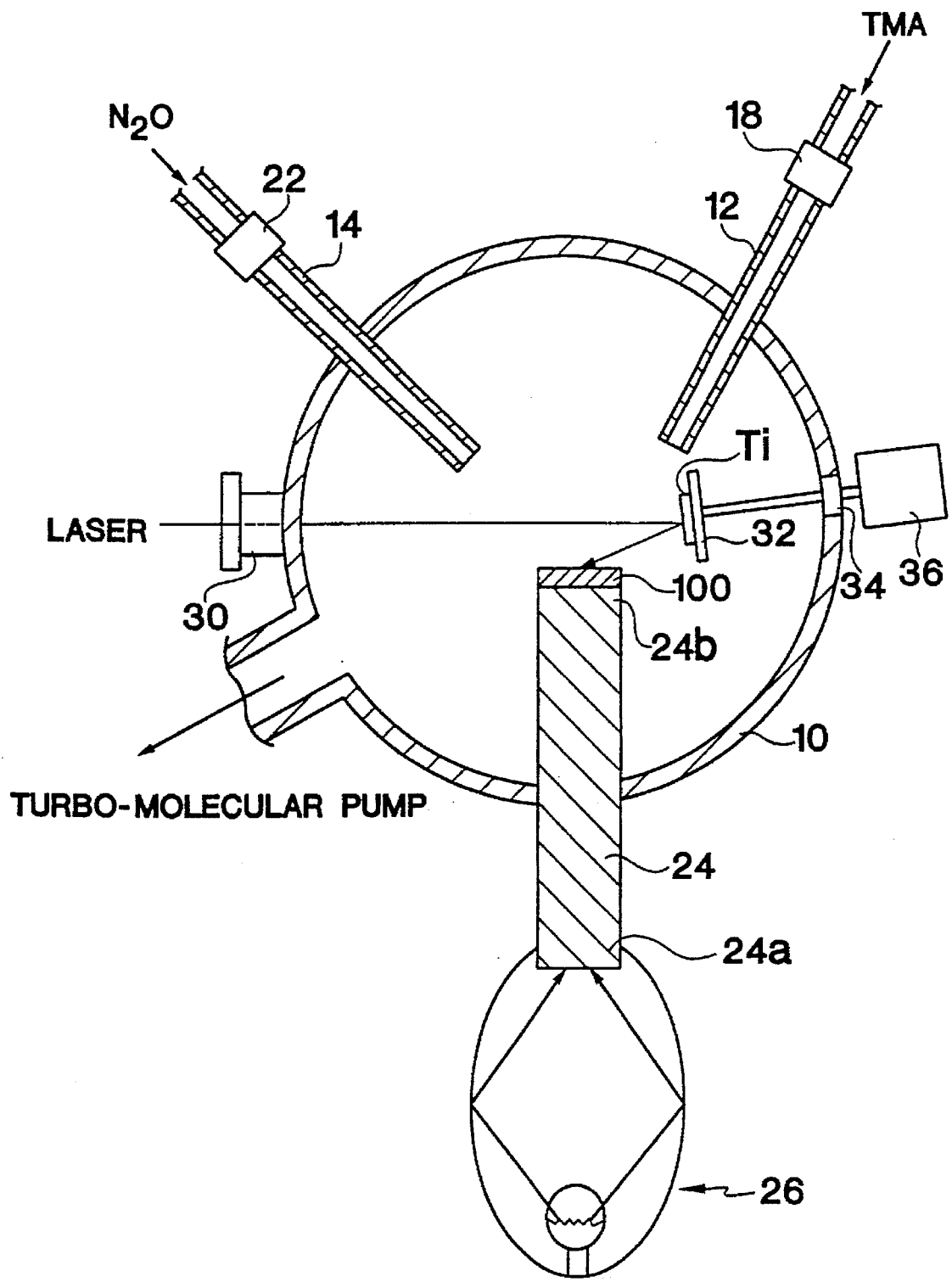
FIG. 9 is an explanatory view, in sectional construction, illustrating the apparatus for preparing crystalline thin-films for solid-state lasers according to another embodiment of the present invention.

In addition, FIG. 9 illustrates another embodiment of the apparatus for preparing crystalline thin-films for solid-state lasers according to the present invention wherein the corresponding component parts to those of FIG. 1 are represented by the same reference characters as those in FIG. 1, and explanation for the detailed construction and function thereof will be omitted. In the case where a single metal or a metal compound being the metallic material for forming laser host crystal as well as a material of active ionic species are in solid state at normal temperature, the apparatus for preparing crystalline thin-films for solid-state lasers as shown in FIG. 9 may be used for the sake of effecting evaporation by heating, or transpiration by means of laser, electron beam, and ion beam.

In the apparatus for preparing crystalline thin-films for solid-state lasers shown in FIG. 9, the vessel 10 is provided with a window section 30 for introducing laser, whereby it is possible to irradiate laser into the vessel 10 from the outside. Furthermore, the apparatus is constructed in such that a holder 23 for supporting a single metal or a metal compound being the metallic material which forms a solid-state laser material at normal temperature as well as a material of active ionic species is located at a position to which is irradiated laser in the vessel 10, and this holder 32 is rotatably driven by a motor through a magnetic coupling 34.

In the above construction, the apparatus is arranged in accordance with the similar manner as that of the embodiment shown in FIG. 1 in such that into the vessel 10 is delivered TMA as a metallic material for forming the laser host crystal through a connecting tube 12 by opening and closing an electromagnetic valve means 18, and $N_2O$ as an oxidizing agent for forming the laser host crystal through the connecting tube 14 by opening and closing the electromagnetic valve means 20, besides Ti is attached to the holder 32, and the laser introduced from the window section 30 for introducing laser is irradiated to the Ti to heat the same while driving rotatively the holder 32 by means of the motor 36 through the magnetic coupling 34. Thus, the Ti attached to the holder 32 is transpired so that titanium-sapphire (laser host crystal: $Al_2O_3$, active ionic species: Ti) thin films can be formed on the substrate 100.

Moreover, in also the case where a solid material is used as one for forming the laser host crystal, it may be arranged in such that a similar apparatus as in the above described case of Ti is further provided, and laser irradiation is effected to ablate the solid material.

Although not specifically illustrated, electron beam or ion beam may be irradiated in place of the laser in the embodiment shown in FIG. 9, and in this case a source for electron beam or ion beam may be disposed directly on the interior of the vessel 10.

While the metallic material for forming laser host crystal and the oxidizing agent or halogenating agent have been alternately supplied in the above described respective embodiments, the invention is not limited thereto, but the metallic material for forming the laser host crystal may be supplied simultaneously with the oxidizing agent or halogenating agent without supplying them alternately.

Furthermore, heating for the substrate 100 is not limited to heating by means of infrared rays, but resistance heating may be used and in this case, a heating coil may be formed on the substrate 100 to heat electrically the same.

Moreover, it may be arranged in such that a laser irradiates the substrate 100 from the obliquely upper direction in the vessel 10 to heat the substrate 100.

Since the present invention has been constructed as described above, the following advantages are obtained.

The method for preparing crystalline thin-films for solid-state lasers according to the present invention is characterized by the steps of heating a substrate in a vessel under a high vacuum condition, supplying materials for forming the laser material onto the surface of said substrate in the form of a gas, an ion, a singled metal or a metal compound to grow crystal on the surface of said substrate, and supplying a material of active ionic species onto the surface of said substrate simultaneously with supply of said materials for forming the laser host crystal, thereby controlling the valence number of the material of active ionic species so as to be identical with the valence number of the metal ion constituting the crystal of said laser host crystal in the laser crystal. Furthermore, the apparatus for preparing crystalline thin-films for solid-state lasers according to the present invention is characterized by being provided with a vessel the inside of which has been highly evacuated and for containing a substrate onto the surface of which is subjected crystal growth of crystalline thin-films for solid-state lasers, a heating device for heating said substrate, a laser host crystal supplying device for supplying materials for forming the laser host crystal onto the surface of said substrate contained inside said vessel in the form of a gas, an ion, a single metal or a metal compound, and a material of active ionic species supplying device for supplying a material of active ionic species onto the surface of said substrate contained inside said vessel simultaneously with supply of said materials for forming the laser host crystal. Because of the above described construction of the present invention, it is possible that a substrate is heated in a vessel under a high vacuum condition, materials for forming the laser host crystal are supplied onto the surface of the substrate in the form of a gas, an ion, a single metal or a metal compound to effect crystal growth on the surface of the substrate. Thus, it becomes possible to grow solid-state laser crystal on a semiconductor substrate made of Si and the like other than seed crystal as in the case of semiconductor production process-like manner.

Furthermore, since a material of active ionic species is supplied onto the surface of the substrate simultaneously with supply of the materials for forming the laser host crystal, the valence number of the material of active ionic species can be controlled so as to be identical with valence number of the metal ion constituting crystal of the laser host crystal, whereby a solid-state laser crystal having few defects in which no absorption subject or a controlled small amount of absorption subject exists can be prepared.

Still further, it is easy to control a film thickness on the atomic level, and a material of active ionic species can also be uniformly injected from a spatial point of view.

It will be appreciated by those of ordinary skill in the art that the present invention can be embodied in other specific forms without departing from the spirit or essential characteristics thereof.

The presently disclosed embodiments are therefore considered in all respects to be illustrative and not restrictive. The scope of the invention is indicated by the appended claims rather than the foregoing description, and all changes that come within the meaning and range of equivalents thereof are intended to be embraced therein.

What is claimed is:

1. A method for preparing crystalline thin-films for solid-state lasers comprising the steps of heating a substrate in a vessel under a high vacuum condition, supplying a material for forming a laser host crystal onto the surface of said substrate in the form of gas, ion, single metal or metal compound to grow said host crystal on the surface of said substrate, and separately supplying a material of active ionic species onto the surface of said substrate simultaneously with supply of said material for forming said laser host crystal, thereby controlling the valence number of said material of active ionic species so as to be identical with the valence number of the metal ion constituting the crystal of said laser host crystal.

2. A method for preparing crystalline thin-films for solid-state lasers as claimed in claim 1 wherein said materials for forming the laser host crystal are composed of a metallic material and an oxidizing agent or a halogenating agent, and said metallic material and said oxidizing or halogenating agent are alternately or simultaneously supplied onto the surface of said substrate.

3. A method for preparing crystalline thin-films for solid-state lasers as claimed in claim 2 wherein said material of active ionic species is supplied onto the surface of said substrate simultaneously with supply of said metallic material.

4. A method for preparing crystalline thin-films for solid-state lasers as claimed in claim 1 wherein lattice constant of said laser host crystal matches with that of said substrate.

5. A method for preparing crystalline thin-films for solid-state lasers as claimed in any one of claims 1, 2, 3 and 4 wherein in the case where a single metal or a metal compound being the metallic material for forming said laser host crystal as well as said material of active ionic species are in solid-state at normal temperature, these materials are supplied onto the surface of said substrate after evaporation of these materials by heating or transpiration or ablation of the materials by laser, electron beam or ion beam.

6. The method according to claim 2 wherein said metallic material is at least one selected from the group consisting of aluminum-containing and yttrium-containing materials.

7. The method according to claim 6 wherein said aluminum-containing material is selected from the group consisting of Al, $AlF_3$, $AlCl_3$, $AlBr_3$, $AlI_3$, $Al(OCH_3)_3$, $Al(OC_2H_5)_3$, $Al(i-OC_3H_7)_3$, $Al(OC_4H_9)_3$, $AL(CH_3)_3$, $Al(C_2H_5)_3$, $Al(C_3H_7)_3$, $Al(i-C_4H_9)_3$, $Al(CH_3)_2Cl$ $Al(CH_3)Cl_2$, $Al_2(CH_3)_3Cl_3$, $Al(C_2H_5)_2Cl$, $Al(C_2H_5)Cl_2$, $Al_2O_3$, $Al(CH_3)_2H$, $Al(C_2H_5)_2H$, $Al(i-C_4H_9)_2H$, $AlH_3 \cdot N(CH_3)_3$, $AlH_3 \cdot N(C_2H_5)_3$, $AlH_3 \cdot N(CH_3)_2(C_2H_5)$, $AlH_3 \cdot N(C_3H_7)_3$, and $AlH_3 \cdot N(C_4H_9)_3$.

8. The method according to claim 6 wherein said yttrium-containing material is selected from the group consisting of Y, $YF_3$, $YCl_3$, $Y_2O_3$, Y(acetyl acetone)$_3$, Y(dipivaloyl methane)$_3$, and Y(hexafluoroacetyl acetone)$_3$.

9. The method according to claim 1 wherein the active ionic species is selected from the group consisting of $Ti^{3+}$, $Cr^{3+}$, $Nd^{3+}$, $Gd^{3+}$, $Ho^{3+}$, $Er^{3+}$, $Pr^{3+}$ and $Tm^{3+}$.

10. The method according to claim 1, wherein said substrate is heated to a temperature of at least 320° C.

11. The method according to claim 10, wherein said temperature is between 320° and 600° C.

12. The method according to claim 11, wherein said temperature is 360° C.

13. The method according to claim 1, wherein said high vacuum condition is a pressure of about $1 \times 10^{-7}$ Torr.

14. The method according to claim 1, wherein said material for forming the laser host crystal and said material of active ionic species are supplied at pressures of about $2 \times 10^{-4}$ Torr or less.

* * * * *